United States Patent [19]

Hasegawa

[11] Patent Number: 5,466,887
[45] Date of Patent: Nov. 14, 1995

[54] RESIN-PACKAGED ELECTRONIC COMPONENT

[75] Inventor: Miki Hasegawa, Kyoto, Japan

[73] Assignee: Rohm Co. Ltd., Kyoto, Japan

[21] Appl. No.: 294,012

[22] Filed: Aug. 23, 1994

[30] Foreign Application Priority Data

Aug. 26, 1993 [JP] Japan ................... 5-211720

[51] Int. Cl.⁶ ................................ H01L 23/28
[52] U.S. Cl. ..................... 174/52.2; 361/301.3
[58] Field of Search ................. 174/52.1–52.4, 174/52.2, 52.3; 257/787, 788, 790, 795; 361/301.3

[56] References Cited

U.S. PATENT DOCUMENTS

| | | | |
|---|---|---|---|
| 4,682,270 | 7/1987 | Whitehead | 174/52.4 |
| 4,920,404 | 4/1990 | Shrimali et al. | 174/52.2 X |
| 5,095,360 | 3/1992 | Kizaki et al. | 357/74 |
| 5,107,073 | 4/1992 | Steffen | 174/52.1 |
| 5,229,642 | 7/1993 | Hara et al. | 257/691 |
| 5,309,026 | 5/1994 | Matsumoto | 257/787 |
| 5,313,102 | 5/1994 | Lim et al. | 257/787 |
| 5,315,155 | 5/1994 | O'Donnelly et al. | 257/711 |

FOREIGN PATENT DOCUMENTS 330977  5/1991  Japan .

*Primary Examiner*—Kristine L. Kincaid
*Assistant Examiner*—Christopher Horgan
*Attorney, Agent, or Firm*—Michael D. Bednarek

[57] ABSTRACT

A resin-packaged electronic component is provided which comprises an electronic element enclosed in a thermosetting resin package having a mounting face. The resin package is provided with at least one stress concentrating portion extending substantially in parallel to the mounting face and contained in an imaginary plane extending between the electronic element and the mounting face.

6 Claims, 3 Drawing Sheets

RESIN-PACKAGED ELECTRONIC COMPONENT

BACKGROUND OF THE INVENTION

1. Field of the Invention

This invention relates to an electronic component of the type which comprises an electronic element (e.g. solid electroltic capacitor element, transistor chip, diode chip, IC chip, or etc.) enclosed in a thermosetting resin package.

2. Description of the Related Art

As is well known, a resin-packaged electronic component such as solid electrolytic capacitor, transistor, diode or IC comprises an electronic element enclosed in a thermosetting resin package from which a plurality of leads extend out. Such an electronic component is disclosed in Japanese Patent Publication No. 3(1991)-30977 for example.

In general, an electronic component is manufactured by a transfer molding method. Specifically, the electronic element together with the leads is clamped between a pair of mold members defining a mold cavity, and an amount of thermosetting resin (e.g. epoxy resin) in fluid state is injected in the mold cavity under a high pressure. The resin is first heated for hardening and then cooled to provide a final product.

With the prior art electronic component, the electronic element, the lead and the resin package all have different coefficients of thermal expansion. Thus, after performing the transfer molding described above, the resin package will inevitably have residual internal stresses due to a difference in thermal expansion between the electronic element, the lead and the resin package.

In use, since the electronic component is repetitively subjected to thermal loads, the residual internal stresses of the resin package may develop into cracks. In reality, the crack sometimes reaches the electronic element, in which case the resin package fails to provide a sufficient protection for the electronic element which may be very sensitive. For instance, the external mositure may permeate to the electronic element through the crack, consequently damaging or deteriorating the sensitive element.

SUMMARY OF THE INVENTION

It is, therefore, an object of the present invention to provide a resin-packaged electronic component in which the electronic element such as capacitor element or semiconductor chip is reliably prevented from being damaged or deteriorated by crack formation.

According to the present invention, there is provided a resin-packaged electronic component comprising an electronic element enclosed in a thermosetting resin package having a mounting face, wherein the package is provided with at least one stress concentrating portion extending substantially in parallel to the mounting face and contained in an imaginary plane extending between the electronic element and the mounting face.

The present invention is based on the experimental finding that the residual internal stresses of the resin package are removed or greatly reduced once a crack is formed under repetitive thermal loads. Thus, the package is prevented from further crack formation which might result from the residual internal stresses.

With the arrangement described above, the stress concentrating portion positively provides a position at which a crack is readily formed when the resin package is repetitively subjected to thermal loads, but the crack thus formed does not reach the electronic element due to the specific location of the stress concentratign portion. Therefore, the electronic element can be prevented from being damaged or deteriorated by a crack reaching it.

According to a preferred embodiment of the present invention, the resin package has at least one lateral face which is formed with a stress concentrating groove, as the stress concentrating portion, adjacent to the mounting face.

According to another preferred embodiment of the present invention, the stress concentrating portion comprises a stress concentrating laminate embedded in the package. In this case, the laminate includes a first resin plate held in contact with the electronic element and made of a same resin material as the package, and a second resin plate attached to the first resin plate and made of a different resin material to differ from the first resin plate with respect to coefficient of thermal expansion.

Other objects, features and advantages of the present invention will be fully understood from the following detailed description given with reference to the accompanying drawings.

DETAILED DESCRIPTION OF THE PREFERRED EMBODIMENTS

Figure 1:
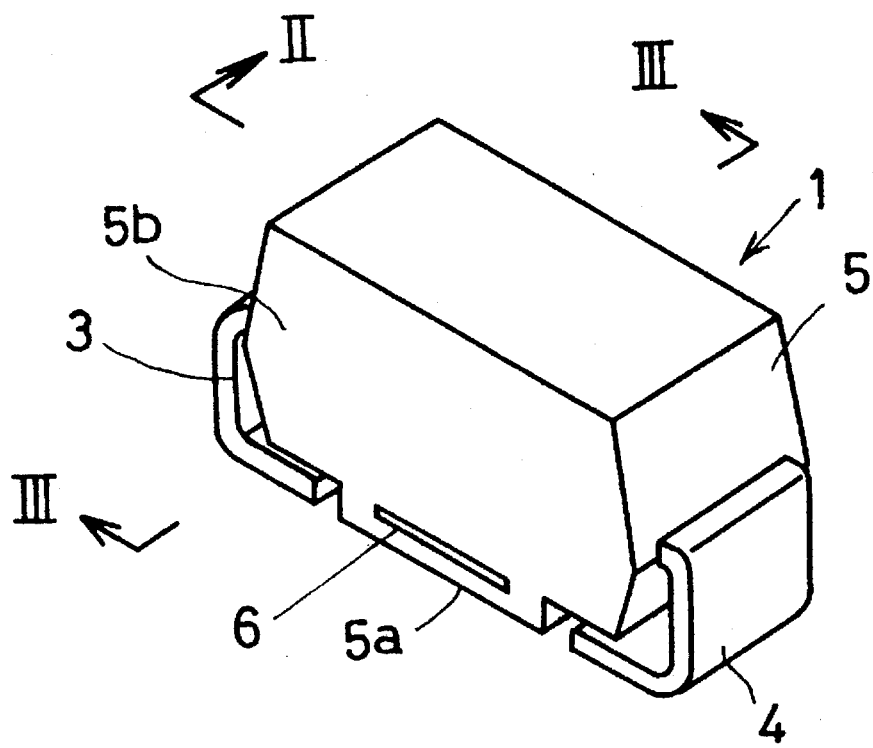
FIG. 1 is a perspective view showing a resin-packaged solid electrolytic capacitor embodying the present invention.
Figure 2:
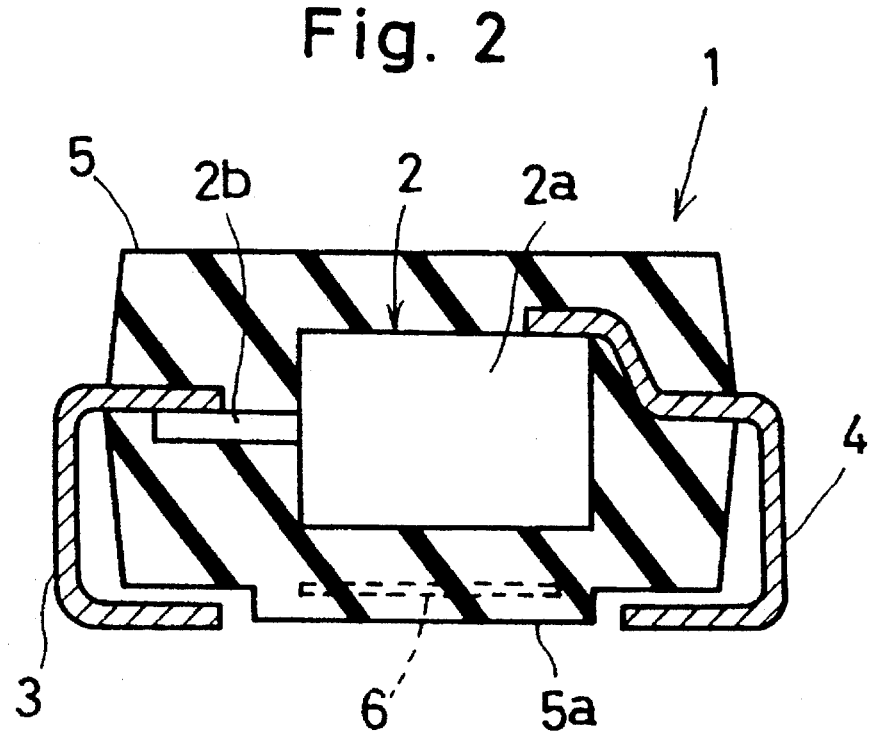
FIG. 2 is a sectional view taken on lines II—II in FIG. 1.
Figure 3:
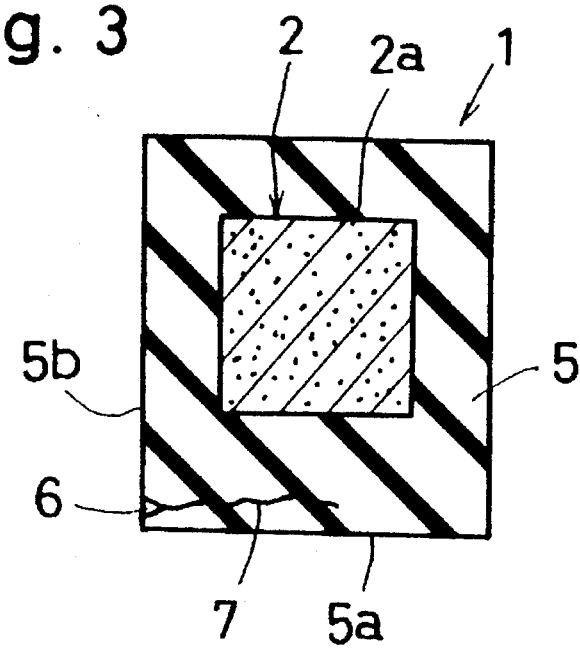
FIG. 3 is a sectional view taken on lines III—III in FIG. 1.

FIGS. 1 to 3 of the accompanying drawings show a first embodiment of the present invention wherein a solid electrolytic capacitor 1 is taken up as an example of resin-packaged electronic component. The capacitor 1 may be a tantalum capacitor or an aluminum capacitor for example.

The capacitor 1 of the first embodiment comprises a capacitor element 2 which includes a chip 2a and an anode wire 2b projecting from the chip 2a. The chip 2a may be a compacted mass of tantalum powder for example, in which case the anode wire 2b is also made of tantalum.

The capacitor 1 also includes an anode lead 3 (positive lead) and a cathode lead 4 (negative lead), each of which is in the form of a metal plate. The anode lead 3 is electrically connected to the anode wire 2b by welding for example. The cathode lead 4 is electrically connected directly to the chip 2a by soldering or by using a conductive adhesive. Alternatively, the cathode lead 4 may be electrically connected to the chip 2a via an unillustrated safety fuse (not shown) which may be a temperature fuse or an overcurrent fuse for example.

The capacitor element 2 together with part of the respective leads 3, 4 are enclosed in a package 5 of a hard thermosetting resin (epoxy resin for example). The projecting portion of each of the respective leads 3, 4 is bent downwardly and inwardly toward the underside 5a (mounting face) of the resin package 5 for conveniently mounting on a surface of a printed circuit board (not shown) by soldering for example.

According to the first embodiment, the resin package 5 has a lateral face 5b formed with a stress concentrating groove 6 extending substantially in parallel to the underside 5a of the package 5 adjacent thereto. The groove 6 may be formed simultaneously with forming the package 5 by transfer molding. Alternatively, the groove 6 may be formed by scribing with a scriber or knife after the package 5 is molded.

In use, the capacitor 1 is repetitively subjected to thermal loads. Under such thermal loads, the internal stresses, which result from previous molding of the package 5 and remains within the package 5, concentrate at the stress concentrating groove 6, thereby forming a crack 7 (see FIG. 3) starting at the groove 6. However, since the groove 6 extends substantially in parallel to the underside 5a of the package 5 adjacent thereto, the crack 7 will not reach the capacitor element 2.

Once the crack 7 is formed, the residual internal stresses of the resin package 5 are removed or greatly reduced. As a result, the resin package 5 no longer undergoes crack formation even if the capacitor 1 is subjected to repetitive thermal loads. Further, due to the location of the stress concentrating groove 6, the removal of the residual internal stresses by the positive formation of the crack 7 does not cause any damage to the capacitor element 2.

Figure 4:
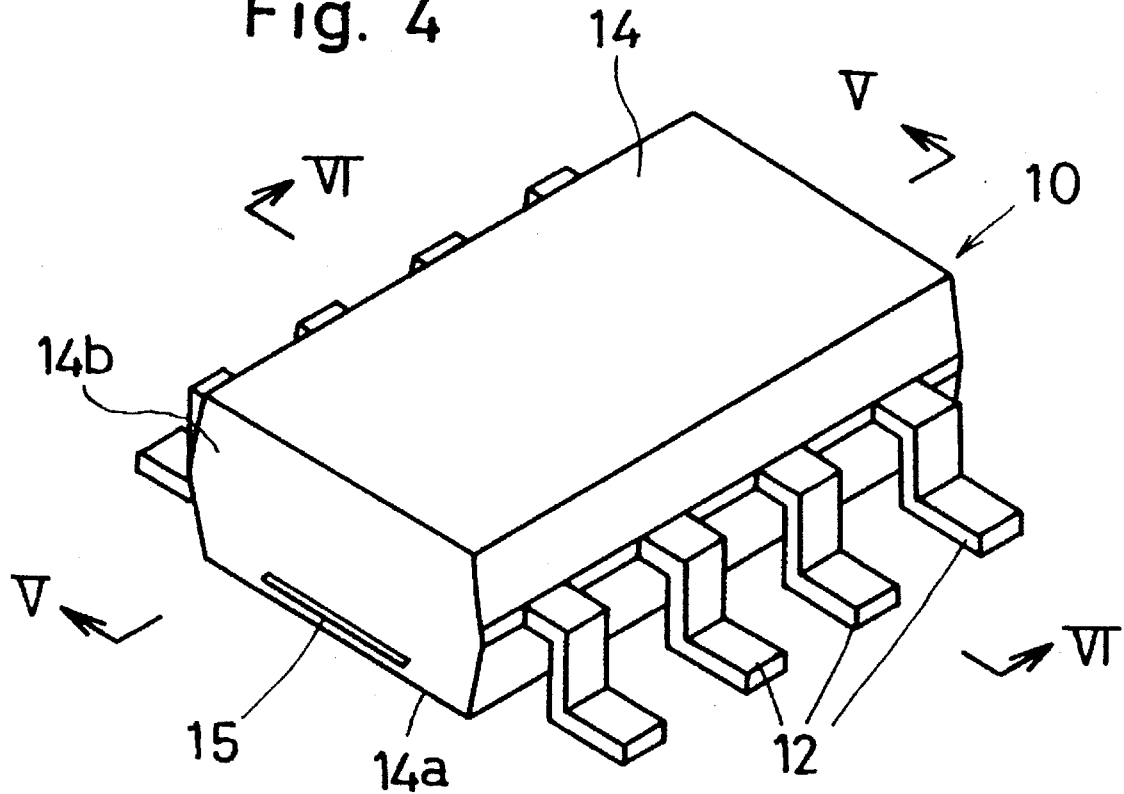
FIG. 4 is a perspective view showing a resin-packaged IC device embodying the present invention.
Figure 5:
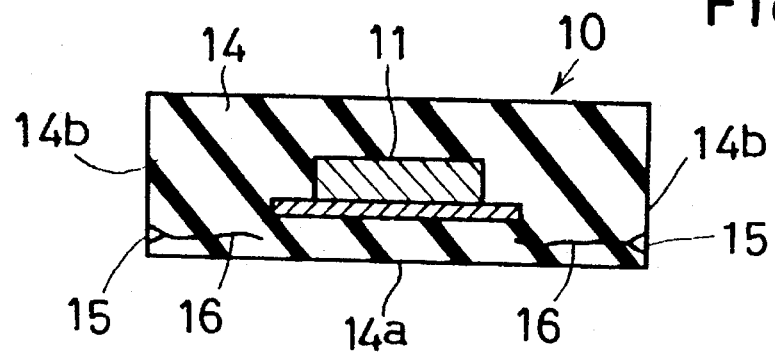
FIG. 5 is a sectional view taken on lines V—V in FIG. 4.
Figure 6:
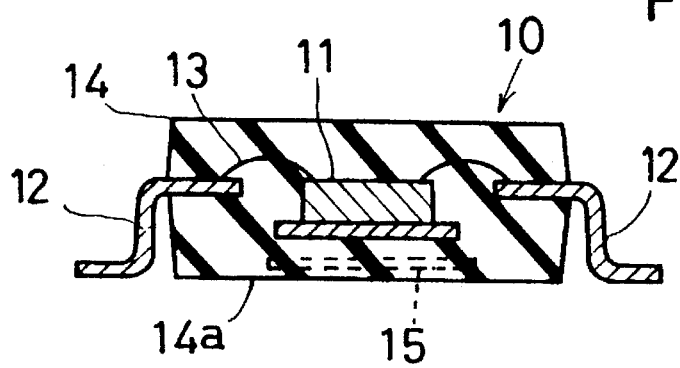
FIG. 6 is a sectional view taken along lines VI—VI in FIG. 1.

FIGS. 4 to 6 show a second embodiment of the present invention wherein an IC device 10 is taken up as an example of resin-packaged electronic component. The IC device 10 comprises a semiconductor chip 11 and a plurality of leads 12 electrically connected to the chip 11 through respective wires 13.

The semiconductor chip 11 together with the respective inner ends of the leads 12 and the wires 13 are enclosed in a package 14 of a hard thermosetting resin (epoxy resin for example). The projecting portion of each of the respective leads 12 is bent downwardly and outwardly away from the underside 14a (mounting face) of the resin package 14 for conveniently mounting on a surface of a printed circuit board (not shown) by soldering for example. Further, the resin package 14 has an opposite pair of lateral faces 14b each of which is formed with a stress concentrating groove 15 extending substantially in parallel to the underside 14a of the package 14 adjacent thereto.

In use, the IC device 10 is repetitively subjected to thermal loads. Under such thermal loads, the internal stresses remaining within the package 14 concentrate at each stress concentrating groove 15, thereby forming a crack 16 (see FIG. 5) starting at the groove 15. However, since the groove 15 extends substantially in parallel to the underside 14a of the package 14 adjacent thereto, the crack 16 will not reach the semiconductor chip 11.

Once the crack 16 is formed, the residual internal stresses of the resin package 14 are removed or greatly reduced. As a result, the resin package 14 no longer undergoes crack formation even if the IC device 10 is subjected to repetitive thermal loads. Further, due to the location of each stress concentrating groove 15, the removal of the residual internal stresses by the positive formation of the crack does not cause any damage to the semiconductor chip 11.

Figure 7:
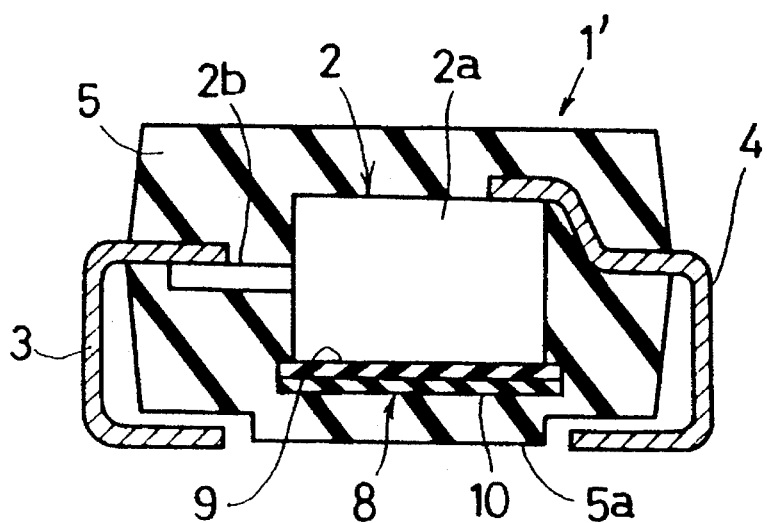
FIG. 7 is a perspective view showing another resin-packaged solid electrolytic capacitor embodying the present invention.

FIG. 7 shows a solid electrolytic capacitor 1' as a third embodiment of the present invention. Similarly to the first embodiment, the capacitor 1' of this embodiment comprises a capacitor element 2, an anode lead 3, a cathode lead 4, and a resin package 5. However, the third embodiment differs from the first embodiment in that a stress concentrating laminate 8 is embedded in the resin package below the capacitor element 2 substantially in parallel to the underside 5a of the resin package 5.

Specifically, the stress concentrating laminate 8 includes a first resin plate 9 which is made of the same resin material as the resin package 5, and a second resin plate 10 which is made of a different resin material such as butadien rubber and joined to the first resin plate 10. Thus, the first resin plate 9 is integrated substantially entirely with the subsequently molded resin package 5 to protect the underside of the capacitor element 2, whereas the first and second plates 9, 10 have different coefficients of thermal expansion.

In use, the capacitor 1 is repetitively subjected to thermal loads. Under such thermal loads, the residual internal stresses of the package 5 concentrate at the boundary between the first and second plates 9, 10 due to a difference in thermal expansion, thereby causing separation between the two plates 9, 10 and possibly forming a crack which starts from the separated boundary.

Once the separation occurs and/or the crack is formed, the residual internal stresses of the resin package 5 are removed or greatly reduced. As a result, the resin package 5 no longer undergoes cracks formation even if the capacitor 1 is subjected to repetitive thermal loads. Further, due to the location of the stress concentrating laminate 8, the removal of the remaining internal stresses by the positive formation of the crack does not cause any damage to the capacitor element 2.

The preferred embodiments of the present invention being thus described, it is obvious that the same may be varied in many ways. For instance, the present invention is applicable not only to resin-packaged capacitors and IC devices but also to other types of resin-packaged electronic components such as resin-packaged transistors and diodes. Such variations are not to be regarded as a departure from the spirit and scope of the present invention, and all such modifications as would be obvious to those skilled in the art are intended to be included within the scope of the following claims.

I claim:

1. A resin-packaged electronic component comprising an electronic element enclosed in a thermosetting resin package having a mounting face, wherein the package has at least one lateral face which is formed with a stress concentrating groove extending substantially in parallel to the mounting face and contained in an imaginary plane extending between the electronic element and the mounting face, the stress concentrating groove having a depth direction extending substantially in parallel to the mounting face.

2. The component according to claim 1, wherein the stress concentrating groove is positioned adjacent to the mounting face.

3. A resin-packaged electronic component comprising an electronic element enclosed in a thermosetting resin package having a mounting face, wherein the package has an opposite pair of lateral faces each of which is formed with a stress concentrating groove extending substantially in parallel to the mounting face and contained in an imaginary plane extending between the electronic element and the mounting face, the stress concentrating groove having a depth direction extending substantially in parallel to the mounting face.

4. The component according to claim 3, wherein the stress concentrating groove is positioned adjacent to the mounting face.

5. The resin-packaged electronic component comprising an electronic element enclosed in a thermosetting resin package having a mounting face, wherein the package is provided with at least one stress concentrating portion extending substantially in parallel to the mounting face and contained in an imaginary plane extending between the electronic element and the mounting face, and wherein the stress concentrating portion comprises a stress concentrating laminate embedded in the package, the laminate including a first resin plate held in contact with the electronic element and made of a same resin material as the package, and a second resin plate attached to the first resin plate and made of a different resin material to differ from the first resin plate with respect to coefficient of thermal expansion.

6. The component according to claim 5, wherein the resin package and the first resin plate are made of epoxy resin, whereas the second plate is made of butadien rubber.

* * * * *